(12) United States Patent
Suzuki et al.

(10) Patent No.: US 8,207,488 B2
(45) Date of Patent: Jun. 26, 2012

(54) PHOTODETECTOR CIRCUIT

(75) Inventors: Takashi Suzuki, Hamamatsu (JP);
Yoshitaka Terada, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 315 days.

(21) Appl. No.: 12/656,937

(22) Filed: Feb. 19, 2010

(65) Prior Publication Data

US 2010/0148036 A1   Jun. 17, 2010

Related U.S. Application Data

(62) Division of application No. 11/886,145, filed as application No. PCT/JP2006/304910 on Mar. 13, 2006, now Pat. No. 7,763,838.

(30) Foreign Application Priority Data

Mar. 14, 2005   (JP) .............................. P2005-071402

(51) Int. Cl.
*H01L 31/101* (2006.01)
*H01L 31/09* (2006.01)

(52) U.S. Cl. ............... 250/214 A; 250/208.1; 250/208.2

(58) Field of Classification Search ............... 250/208.1, 250/208.2, 214 A, 214 R
See application file for complete search history.

(56) References Cited

U.S. PATENT DOCUMENTS

| | | | |
|---|---|---|---|
| 5,563,406 A | 10/1996 | Durst et al. | |
| 6,650,614 B1 | 11/2003 | Pietruszynski et al. | |
| 7,031,236 B2 | 4/2006 | Pietruszynski et al. | |
| 2004/0008270 A1 | 1/2004 | Hisamatsu et al. | |
| 2004/0027471 A1 | 2/2004 | Koseki et al. | |
| 2004/0169840 A1 | 9/2004 | Hoashi et al. | |

FOREIGN PATENT DOCUMENTS

| | | |
|---|---|---|
| JP | 60-033718 A | 2/1985 |
| JP | 62-165128 | 7/1987 |
| JP | 63-181840 | 11/1988 |
| JP | 64-020418 | 1/1989 |
| JP | 5-227104 A | 9/1993 |
| JP | 6-11390 | 1/1994 |
| JP | 6-232917 A | 8/1994 |
| JP | 7-39112 | 7/1995 |
| JP | 7-191148 A | 7/1995 |
| JP | 7-303119 A | 11/1995 |
| JP | 08-068667 | 3/1996 |
| JP | 9-257417 A | 10/1997 |
| JP | 10-126696 | 5/1998 |
| JP | 11-132846 A | 5/1999 |
| JP | 11-145913 A | 5/1999 |
| JP | 2000-101392 | 4/2000 |
| JP | 2002-335133 | 11/2002 |
| JP | 2003-179442 | 6/2003 |
| JP | 2003-348376 | 12/2003 |
| JP | 2003-348464 | 12/2003 |
| JP | 2004-177350 | 6/2004 |

*Primary Examiner* — Tony Ko
(74) *Attorney, Agent, or Firm* — Drinker Biddle & Reath LLP

(57) ABSTRACT

A photodetecting circuit includes an adder that selectively adds outputs of a plurality of circuits for photodetection. Each of the circuits for photodetection includes: a element for photodetecting; a transimpedance amplifier for photodetection, with a first input terminal connected to the photodetecting element; a transconductance amplifier, with a first input terminal connected to an output terminal of the transimpedance amplifier; and a feedback circuit, connected between the output terminal of the transimpedance amplifier for photodetection and the first input terminal of the transimpedance amplifier for photodetection and applying feedback to keep fixed an output voltage of the transimpedance amplifier for photodetection.

5 Claims, 9 Drawing Sheets

PHOTODETECTOR CIRCUIT

This is a divisional application of application Ser. No. 11/886,145, having a §371 date of Apr. 29, 2008 now U.S. Pat. No. 7,763,838, which is a national stage filing based on PCT International Application No. PCT/JP2006/304910, filed on Mar. 13, 2006. The application Ser. No. 11/886,145 is incorporated by reference herein in its entirety.

TECHNICAL FIELD

The present invention relates to a photodetecting circuit used in a vehicle-installed radar apparatus.

BACKGROUND ART

Recently, vehicle-installed radar devices, employing laser light and being for lightening the burden placed on a driver, improving convenience, and improving safety, are being developed. With such a vehicle-installed radar apparatus, laser light emitted from a light emitting element is illuminated, by a polygon mirror having a plurality of reflecting angles, in a plurality of directions spanning at least the interior of a predetermined angular range in a vehicle width direction. The vehicle-installed radar apparatus detects reflected light of each laser light by a photodetecting circuit and detects a reflecting object based on a time between a timing of illumination of laser light and a timing of photodetection of reflected light.

The photodetecting circuit used in the vehicle-installed laser apparatus is required to be high in detection precision and, for example, Patent Document 1 discloses a photodetecting circuit that is improved in detection sensitivity of reflected light reflected from a reflecting object. With the photodetecting circuit described in Patent Document 1, a predetermined number of photodetecting signals that are output based on a predetermined number of laser beams, which are illuminated adjacently, are summed and a summed signal is output. By summing a predetermined number of photodetecting signals, the photodetecting signal component corresponding to the reflected light from the reflecting object is amplified. It is thus deemed that the sensitivity of detection of the reflected light from the reflecting object is improved.

Patent Document 1: Japanese Published Unexamined Patent Application No. 2004-177350

Problems to be Solved by the Invention

The photodetecting timing of reflected light from the reflecting object is the timing at which the summed signal, that is, the voltage in accordance with the intensity of reflected light crosses a reference voltage. Thus, generally in order to improve the detection precision of the photodetecting circuit, the reference voltage is set close to a DC voltage of the voltage that is in accordance with the intensity of reflected light so that even if the voltage that is in accordance with the intensity of reflected light is small, it crosses the reference voltage.

However, normally, a detected light, detected by a photodetecting circuit, contains disturbing light that is present in an outdoor environment in addition to the reflected light. When this disturbing light is strong, the DC voltage of the voltage that is in accordance with the intensity of detected light, that is, the voltage that is in accordance with the intensity of the disturbing light varies and situations arise in which the voltage that is in accordance with the intensity, of reflected light does not cross the reference voltage. When the disturbing light is even stronger, an amplifying circuit, etc. used in the photodetecting circuit becomes saturated, causing the output of the photodetecting circuit to be no longer a voltage that is in accordance with the intensity of the disturbing light.

Thus, an object of the present invention is to provide a photodetecting circuit, with which a precision of detection of reflected light reflected by a reflecting object can be improved without being affected by disturbing light present in an outdoor environment and with which this improvement can be realized by a simple circuit arrangement.

Means for Solving the Problems

A photodetecting circuit according to a first aspect of the present invention includes an adder that selectively adds outputs of a plurality of photodetecting circuits, and each of the photodetecting circuits includes: a photodetecting element; a transimpedance amplifier for photodetection, with a first input terminal connected to the photodetecting element; a transconductance amplifier, with a first input terminal connected to an output terminal of the transimpedance amplifier for photodetection; and a feedback circuit, connected between the output terminal of the transimpedance amplifier for photodetection and the first input terminal of the transimpedance amplifier for photodetection and applying feedback to keep fixed an output voltage of the transimpedance amplifier for photodetection. Each of the first input terminals is, for example, an inverted input terminal of an operational amplifier.

With the present invention, because the feedback circuit applies feedback to keep fixed the output voltage of the transimpedance amplifier for photodetection, even if disturbing light present in an outdoor environment varies, the output voltage of the adder is kept fixed.

With a photodetecting circuit according to a second aspect of the present invention, the feedback circuit of the photodetecting circuit according to the first aspect of the invention includes: a feedback error amplifier; a smoothing circuit; and a feedback transistor. With the feedback error amplifier, a first input terminal is connected to the output terminal of the transimpedance amplifier for photodetection and a reference voltage for photodetection is input into a second input terminal. An input terminal of the smoothing circuit is connected to an output terminal of the feedback error amplifier. With the feedback transistor, a control terminal is connected to an output terminal of the smoothing circuit and a terminal connected to the photodetecting element is connected to the first input terminal of the transimpedance amplifier for photodetection.

With the present invention, a DC component and low frequency components of a current that is input into the transimpedance amplifier for photodetection flow into the feedback transistor, and with an output voltage of the transimpedance amplifier for photodetection, low frequency components are reduced and a DC component is kept at the reference voltage for photodetection. That is, by the feedback circuit eliminating the DC component and the low frequency components of the input current of the transimpedance amplifier for photodetection, the low frequency components of the output voltage of the transimpedance amplifier for photodetection are reduced and the DC component of the output voltage is kept fixed. Thus, even if the disturbing light present in the outdoor environment varies, low frequency components of the output voltage of the adder are reduced and a DC component of the output voltage is kept fixed.

With a photodetecting circuit according to a third aspect of the present invention, the feedback circuit of the photodetecting circuit according to the first aspect of the invention includes: a feedback error amplifier; a smoothing circuit; and a feedback transistor. With the feedback error amplifier, a first input terminal is connected to the output terminal of the transimpedance amplifier for photodetection and a first input terminal of the transimpedance amplifier for photodetection is input into a second input terminal. An input terminal of the smoothing circuit is connected to an output terminal of the feedback error amplifier. With the feedback transistor, a control terminal is connected to an output terminal of the smoothing circuit and a terminal connected to the photodetecting element is connected to the first input terminal of the transimpedance amplifier for photodetection.

With the present invention, the DC component and the low frequency components of the input current of the transimpedance amplifier for photodetection flow into the feedback transistor, and with the output voltage of the transimpedance amplifier for photodetection, the low frequency components are reduced and the DC component is kept at a voltage of the first input terminal of the transimpedance amplifier for photodetection. That is, by the feedback circuit eliminating the DC component and the low frequency components of the input current of the transimpedance amplifier for photodetection, the low frequency components of the output voltage of the transimpedance amplifier for photodetection are reduced and the DC component of the output voltage is kept fixed. Thus, even if the disturbing light present in the outdoor environment varies, the low frequency components of the output voltage of the adder are reduced and the DC component of the output voltage is kept fixed.

With a photodetecting circuit according to a fourth aspect of the present invention, the transimpedance amplifier for photodetection of the photodetecting circuit according to the second aspect of the invention includes: an operational amplifier for photodetection; and a first feedback resistor for photodetection. With the operational amplifier for photodetection, a first input terminal, which is the first input terminal of the transimpedance amplifier for photodetection, is connected to the photodetecting element, and the reference voltage for photodetection is input into a second input terminal. The first feedback resistor for photodetection is connected between an output terminal of the operational amplifier for photodetection, which is the output terminal of the transimpedance amplifier for photodetection, and the first input terminal of the operational amplifier for photodetection.

With a photodetecting circuit according to a fifth aspect of the present invention, the transimpedance amplifier for photodetection of the photodetecting circuit according to the third aspect of the invention includes: a transistor for photodetection; a current control resistor; and a second feedback resistor for photodetection. With the transistor for photodetection, a control terminal, which is the first input terminal of the transimpedance amplifier for photodetection, is connected to the photodetecting element. The current control resistor is connected between an output terminal of the transistor for photodetection, which is the output terminal of the transimpedance amplifier for photodetection, and a fixed potential. The second feedback resistor for photodetection is connected between the output terminal of the transistor photodetection and the control terminal of the transistor for photodetection.

With the present invention the reference voltage for photodetection is made unnecessary. The circuit can thus be reduced. With a photodetecting circuit according to a sixth aspect of the present invention, the second input terminal of the feedback error amplifier of the photodetecting circuit according to the fifth aspect of the invention is connected to the control terminal of the transistor for photodetection.

With the present invention, a voltage at the control terminal of the transistor for photodetection is used as the reference voltage for photodetection. Based on the voltage at the first input terminal of the transimpedance amplifier for photodetection according to the second aspect of the present invention being substantially equal to the voltage at the second input terminal of the same, the second input terminal of the feedback error amplifier, which is connected to the second input terminal of the transimpedance amplifier for photodetection in the second aspect of the present invention, is connected to the first input terminal of the transimpedance amplifier for photodetection in the third aspect of the present invention. Thus, with the present invention, the transimpedance amplifier for photodetection is constituted of the transistor for photodetection, the current control resistor, and the second feedback resistor for photodetection, and the reference voltage for photodetecting is made unnecessary. The circuit can thus be reduced.

The voltage at the control terminal of the transistor for photodetection is determined by the current at the output terminal of the transistor for photodetection and is substantially fixed. Thus, by the feedback circuit eliminating the DC component and the low frequency components of the input current of the transimpedance amplifier for photodetection, the low frequency components of the output voltage of the transimpedance amplifier for photodetection are reduced and the DC component is kept substantially fixed. Thus, even if the disturbing light present in the outdoor environment becomes strong, the low frequency components of the output voltage of the adder are reduced and the DC component of the output voltage is kept substantially fixed.

With a photodetecting circuit according to a seventh aspect of the present invention, the feedback error amplifier of the photodetecting circuit according to any one of the second to sixth aspects of the invention includes: a first transistor for error amplification; a second transistor for error amplification; a first load for error amplification; a second load for error amplification; and a current supply for error amplification. With the first transistor for error amplification, a control terminal is connected to the output terminal of the transimpedance amplifier for photodetection. With the second transistor for error amplification, the reference voltage for photodetection is input into a control terminal. The first load for error amplification is connected to an output terminal of the first transistor for error amplification. The second load for error amplification is connected to an output terminal of the second transistor for error amplification. The current supply for error amplification is connected to a common node of the first transistor for error amplification and the second transistor for error amplification. The smoothing circuit is just a capacitor that is connected between the input terminal and the output terminal.

With the present invention, by a comparatively large output impedance of the feedback error amplifier and by the capacitor of the smoothing circuit, a low-pass filter that is necessary and adequate is arranged. An adequate feedback can thus be applied to the DC component and the low frequency components of the input current of the transimpedance amplifier for photodetection.

With a photodetecting circuit according to an eighth aspect of the present invention, the transconductance amplifier of the photodetecting circuit according to any one of the first to seventh aspects of the invention includes: a first transistor for conversion; a second transistor for conversion; a first load for conversion; a second load for conversion; and a current supply for conversion. With the first transistor for conversion, a control terminal is connected to the output terminal of the transimpedance amplifier for photodetection. With the second transistor for conversion, a reference voltage for conversion is input into a control terminal. The first load for conversion is connected to an output terminal of the first transistor for conversion. The second load for conversion is connected to an output terminal of the second transistor for conversion. The current supply for conversion is connected to a common node of the first transistor for conversion and the second transistor for conversion.

With a photodetecting circuit according to a ninth aspect of the present invention, the photodetecting circuit according to any one of the first to eighth aspects of the invention further includes: a controlling circuit for selection, selecting outputs of the plurality of photodetecting circuits; and a plurality of selecting switches, inserted between the plurality of photodetecting circuits and the adder and operating according to an output of the controlling circuit for selection. The adder has a transimpedance amplifier for addition, with an input terminal connected to the plurality of photodetecting circuits via the plurality of selecting switches. The transimpedance amplifier for addition includes: an operational amplifier for addition, with a first input terminal connected via the selecting switches to the output terminals of the plurality of photodetecting circuits and a second input terminal connected to a reference voltage for addition; and a feedback resistor for addition, connected between an output terminal of the operational amplifier for addition and the first input terminal of the operational amplifier for addition.

With the present invention, because the adder performs current addition, gain-frequency characteristics of the adder do not vary according to the number of channels as in a case where voltage addition is performed. The gain and frequency band of the adder thus do not vary. Although in performing time-of-flight measurement, with which a reflecting object is detected based on a time between a timing of illumination of laser light and a timing of photodetection of reflected light, the variation of the gain or frequency band of the photodetecting circuit is a cause of measurement error, such a measurement error does not occur with the present invention.

The respective selecting switches that are made to operate by a signal from the controlling circuit for selection selectively connect the respective photodetecting circuits to the adder. Thus, just the necessary and adequate photodetecting circuits, among the plurality of photodetecting circuits, can be connected to the adder for preventing the missing of light in predicting an incident position of reflected pulse light, predicting an incident position of ghost light of reflected pulse light, and photodetecting reflected pulse light. That is, because the photodetecting circuits without output signals can be cut off from the adder, the output of the photodetecting circuit can be made high in S/N ratio.

Also, because a current generated by the disturbing light is eliminated at the input end of the photodetecting circuit, an initial stage amplifier can be made high in sensitivity by setting an initial stage gain to a high value regardless of amplifier saturation due to disturbing light, and the amplifier can thus be made low in noise.

With a photodetecting circuit according to a tenth aspect of the present invention, the photodetecting circuit according to any one of the first to eighth aspects of the invention further includes: a controlling circuit for selection, selecting outputs of the plurality of photodetecting circuits by controlling operation or non-operation of the transconductance amplifiers. The adder has a transimpedance amplifier for addition, with an input terminal connected to the plurality of photodetecting circuits. The transimpedance amplifier for addition includes: a operational amplifier for addition, with a first input terminal connected to the output terminals of the plurality of photodetecting circuits and a second input terminal connected to a reference voltage for addition; and a feedback resistor for addition, connected between an output terminal of the operational amplifier for addition and the first input terminal of the operational amplifier for addition.

With the present invention, because the adder performs current addition, gain-frequency characteristics of the adder do not vary according to the number of channels as in a case where voltage addition is performed. The gain and frequency band of the adder thus do not vary. Thus, a measurement error, such as that described above, does not occur with the present invention.

Also, the transconductance amplifiers of the respective photodetecting circuits operate based on a signal from the controlling circuit for selection. Thus, just the necessary and adequate photodetecting circuits, among the plurality of photodetecting circuits, can be made to operate as described above. That is, because the photodetecting circuits without output signals can be put in the non-operating state, the output of the photodetecting circuit can be made high and the consumption power of the photodetecting circuit can be reduced.

With a photodetecting circuit according to an eleventh aspect of the present invention, the photodetecting circuit according to any one of the first to tenth aspects of the invention further includes a circuit for detecting timing of photodetection that includes: a capacitor for comparison, with a first terminal connected to an output terminal of the adder; a comparator, with a first input terminal connected to a second terminal of the capacitor for comparison and a reference voltage for comparison being input into a second input terminal; a DC voltage supply for comparison, supplying a DC voltage to the first input terminal of the comparator; and a controlling circuit for charge/discharge, inserted between the first input terminal of the comparator and the DC voltage supply for comparison and controlling a potential of the capacitor for comparison.

A circuit for generating reference voltage according to a twelfth aspect of the present invention includes: a photodetecting element; a transistor for photodetection, with a control terminal connected to the photodetecting element; a current controlling resistor, connected between an output terminal of the transistor for photodetection and a fixed potential; a (second) feedback resistor for photodetection, connected between the output terminal of the transistor for photodetection and the control terminal of the transistor for photodetection; an error amplifier for feedback, with a first input terminal connected to the output terminal of the transistor for photodetection and a second input terminal connected to the control terminal of the transistor for photodetection; a smoothing circuit, with an input terminal connected to an output terminal of the error amplifier for feedback; and a transistor for feedback, with a control terminal connected to an output terminal of the smoothing circuit and a terminal, connected to the photodetecting element, being connected to the control terminal of the transistor for photodetection.

With the present invention, when the photodetecting element detects light, a voltage is generated at the output terminal of the transistor for photodetection. When the intensity of the light detected by the photodetecting element varies, although the current flowing through the (second) feedback resistor for photodetection varies and the voltage at the output terminal of the transistor for photodetection varies, by the detection of this variation by the error amplifier for feedback, the smoothing circuit and the transistor for photodetection removes a DC component and low frequency components of the current flowing through the (second) feedback resistor for photodetection. Thus, with the voltage at the output terminal of the transistor for photodetection, the low frequency components are reduced and the DC component is kept fixed and equal to the DC component of the voltage at the control terminal of the transistor for photodetection.

Here, the voltage at the control terminal of the transistor for photodetection is determined by the current at the output terminal of the transistor for photodetection and is substantially fixed. Thus, with the voltage at the output terminal of the transistor for photodetection, the low frequency components are reduced and the DC component is constantly kept fixed.

Effects of the Invention

With the present invention, because the feedback circuit eliminates disturbing light components, reduces the low frequency components of the output voltage of the photodetecting circuit, and keeps the DC component fixed, the output voltage of the photodetecting circuit can be compared with the reference voltage, which is set close to the DC component of the output voltage. Thus, by using the photodetecting circuit of the present invention, the precision of detection of reflected light reflected by a reflecting object can be improved without being influenced by disturbing light present in an outdoor environment.

Also, because the photodetection circuit is partitioned, degradation of the frequency band due to parasitic capacitance of the photodetecting element is alleviated.

Also, because an amplifier is connected according to each photodetecting element, even if the number of photodetecting elements increase or decrease, the gain-frequency characteristics of the amplifier do not fluctuate and the detection precision of the photodetecting circuit is stabilized.

Because the adder performs current addition, gain-frequency characteristics of the adder do not vary according to the number of channels as in a case where voltage addition is performed. The frequency band of the adder thus does not vary. Thus, even if the photodetecting circuit according to the present invention is used for time-of-flight measurement, with which a reflecting object is detected based on a time between a timing of illumination of laser light and a timing of photodetecting of reflected light, the distance to the detected object can be detected at high precision.

Also, because disturbing light components are eliminated according to each circuit for photodetection, even if the disturbing light fluctuates according to each photodetecting element, a high detection precision can be maintained.

Also, because the selecting circuit that selects just the necessary circuits for photodetection among the plurality of circuits for photodetection is provided, the outputs of just the necessary circuits for photodetection can be added. Because the outputs of the unnecessary circuits for photodetection are not added, noise due to unnecessary disturbing light can be eliminated. The photodetection precision can thus be improved by a simple circuit arrangement.

Also, because the selecting circuit that makes only the necessary circuits for photodetection among the plurality of circuits for photodetection operate is provided, the consumption power can be reduced.

Figure 1:
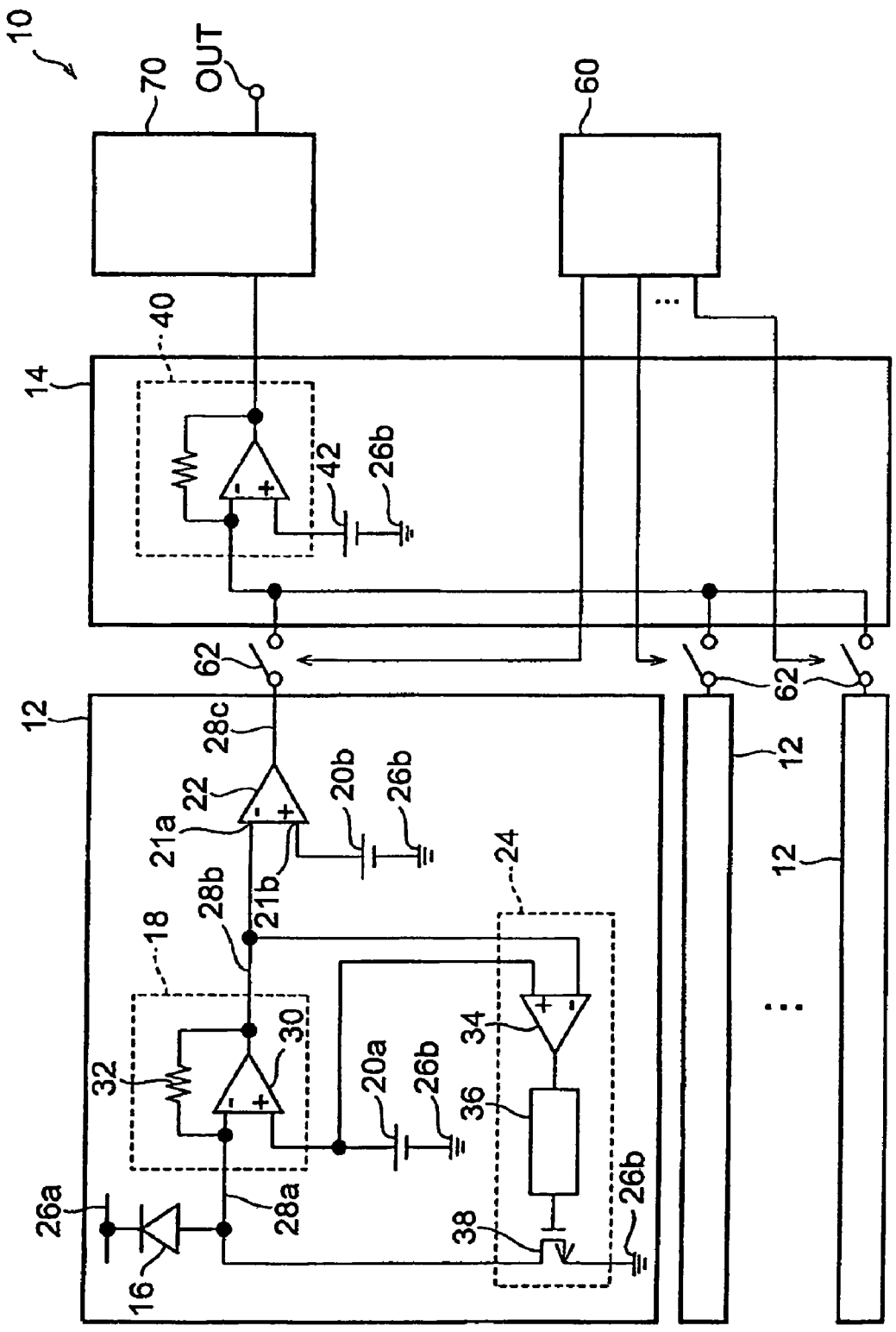
FIG. 1 is a circuit diagram of an arrangement of a photodetecting circuit according to a first embodiment of the present invention.

DESCRIPTION OF THE SYMBOLS 10 photodetecting circuit
12 circuit for photodetection
14 adder
16 photodetecting element
18 transimpedance amplifier for photodetection
20$a$ reference voltage for photodetection
20$b$ reference voltage for conversion
22 transconductance amplifier
24 feedback circuit
30 operational amplifier for photodetection
32 feedback resistor for photodetection
34 error amplifier for feedback
36 smoothing circuit
38 feedback transistor
40 transimpedance amplifier for addition
42 reference voltage for addition
60 controlling circuit for selection
62 selecting switch
70 circuit for detecting timing of photodetection

BEST MODES FOR CARRYING OUT THE INVENTION

Preferred embodiments of the present invention shall now be described in detail with reference to the drawings. In the drawings, portions that are the same or equivalent shall be provided with the same symbol.

FIG. 1 is a circuit diagram of an arrangement of a photodetecting circuit according to a first embodiment of the present invention. The photodetecting circuit 10 shown in FIG. 1 includes a plurality of circuits for photodetection 12, an adder 14, a controlling circuit for selection 60, a plurality of selecting switches 62, and a circuit for detecting timing of photodetection 70. Each circuit for photodetection 12 has a photodetecting element 16, a transimpedance amplifier 18 for photodetection, a reference voltage for photodetection 20$a$, a reference voltage for conversion 20$b$, a transconductance, amplifier 22 for photodetection, and a feedback circuit 24.

As the photodetecting element 16, for example, a photodiode is used. A cathode of the photodetecting element 16 is connected to a first power supply line 26a, and an anode of the photodetecting element 16 is connected to an input node 28a (a first input terminal of the transimpedance amplifier 18 for photodetection). The photodetecting element 16 detects light and generates a current in accordance with the detected light.

The transimpedance amplifier 18 for photodetection includes an operational amplifier 30 for photodetection and a first feedback resistor for photodetection 32. An inverted input terminal (first input terminal) of the operational amplifier 30 for photodetection is connected to the input node 28a, and the reference voltage for photodetection 20a is input into a non-inverted input terminal (second input terminal) of the operational amplifier 30 for photodetection. An output terminal of the operational amplifier 30 for photodetection is connected to a feedback node 28b (an output terminal of the transimpedance amplifier 18 for photodetection).

One end of the first feedback resistor for photodetection 32 is connected to the input node 28a, and another end of the first feedback resistor for photodetection 32 is connected to the feedback node 28b. An output current of the photodetecting element 16 is input into the transimpedance amplifier 18 for photodetection, which outputs a voltage that is in accordance with this current.

The reference voltage for photodetection 20a is a fixed voltage generated by a circuit, such as a band-gap reference circuit, that generates a fixed voltage.

As the transconductance amplifier 22, for example, a differential amplifier is used. A first input terminal 21a of the transconductance amplifier 22 is connected to the feedback node 28b, and the reference voltage for conversion 20b is input into the second input terminal 21b of the transconductance amplifier 22. An output terminal of the transconductance amplifier 22 is connected to an output node 28c. The output voltage of the transimpedance amplifier 18 for photodetection is input into the transconductance amplifier 22 that outputs a current, which, with the inclusion of the polarity, is in accordance with the output voltage.

The reference voltage for conversion 20b is a fixed voltage generated by a circuit, such as a band-gap reference circuit, that generates a fixed voltage. The reference voltage for conversion 20b may be the same as the reference voltage for photodetection 20a. In this case, because tracking between the reference voltage for photodetection 20a and the reference voltage for conversion 20b does not have to be noted, a circuit of a comparatively simple arrangement for generating reference voltage, with which temperature variation and power supply voltage variation are not suppressed, can be used.

The feedback circuit 24 includes a error amplifier for feedback 34, a smoothing circuit 36, and a feedback transistor 38. A negative input terminal (first input terminal) of the error amplifier for feedback 34 is connected to the feedback node 28b, and a positive input terminal (second input terminal) of the error amplifier for feedback 34 is connected to the reference voltage for photodetection 20a. An output terminal of the error amplifier for feedback 34 is connected to an input terminal of the smoothing circuit 36. An output terminal of the smoothing circuit 36 is connected to a control terminal (gate) of the N-type feedback transistor 38.

A first terminal (drain) of the N-type feedback transistor 38 is connected to the input node 28a, and a second terminal (source) of the N-type feedback transistor 38 is connected to a second power supply line 26b.

The feedback circuit 24 eliminates a DC component and low frequency components of the current input into the transimpedance amplifier 18 for photodetection and thereby reduces low frequency components of the output voltage of the transimpedance amplifier 18 for photodetection and keeps a DC component of the output voltage at the reference voltage for photodetection 20a.

The N-type feedback transistor 38 must be made large enough in transistor size so that the DC component and the low frequency components of the input current into the transimpedance amplifier 18 for photodetection can be eliminated, that is, large enough to draw out the DC component and the low frequency components of the disturbing light.

The adder 14 includes a transimpedance amplifier for addition 40, which, for example, is the same as transimpedance amplifier 18 for photodetection, and a reference voltage for addition 42. A negative input terminal (first input terminal) of the transimpedance amplifier for addition 40 is connected to each of the plurality of output nodes 28c via a selecting switch 62, and a positive input terminal of the transimpedance amplifier for addition 40 is connected to the reference voltage for addition 42. The adder 14 selectively adds the output currents of the plurality of photodetection circuits 12 and outputs a voltage that is in accordance with the added currents.

As each selective switch 62, for example, a transistor is used. Each selective switch 62 is switched ON and OFF by the controlling circuit for selection 60. The controlling circuit for selection 60 outputs a signal for selecting the output currents of the circuits for photodetection 12, which, among the plurality of circuits for photodetection 12, are to perform input into the adder 14.

The reference voltage for addition 42 is a fixed voltage generated by a circuit, such as a band-gap reference circuit, that generates a fixed voltage, and may be the same as the reference voltage for photodetection 20a.

The circuit for detecting timing for photodetection 70 has a comparator and a reference voltage for comparison. The detailed arrangement of the circuit for detecting timing for photodetection 70 shall be described later. The circuit for detecting timing for photodetection 70 detects the output voltage from the adder 14 and compares this output voltage with the reference voltage for comparison by means of the comparator to detect the timing of photodetection. The details of a method for detecting the timing of photodetection shall also be described later.

Figure 2:
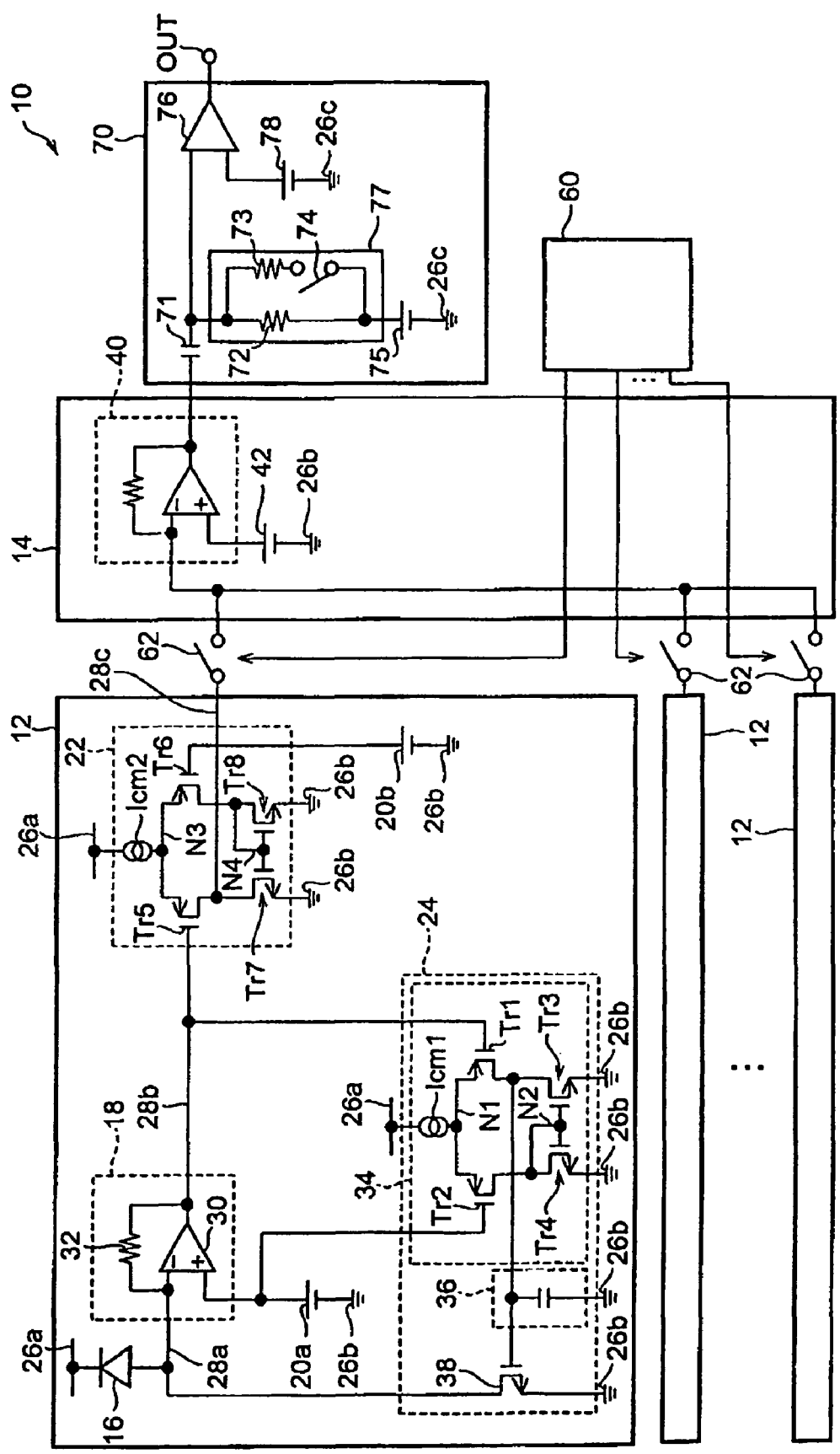
FIG. 2 is a circuit diagram of a specific example of the photodetecting circuit according to the first embodiment of the present invention.

FIG. 2 is a circuit diagram of a specific example of the photodetecting circuit according to the first embodiment of the present invention. As shown in FIG. 2, for example, differential amplifying circuits can be used as the transconductance amplifier 22 and the error amplifier for feedback 34 of the feedback circuit 24 and, for example, a low-pass filter or capacitor can be used as the smoothing circuit 36.

The error amplifier for feedback 34 has a first P-type transistor for error amplification Tr1, a second P-type transistor for error amplification Tr2, an N-type transistor Tr3 (first load for error amplification), an N-type transistor Tr4 (second load for error amplification), and a current supply for error amplification Icm1.

A control terminal (gate) of the first P-type transistor for error amplification Tr1 is connected to the feedback node 28b, a first terminal (drain) of the first P-type transistor for error amplification Tr1 is connected to a first terminal (drain) of the N-type transistor Tr3, and a second terminal (source) of the first P-type transistor for error amplification Tr1 is connected to a common node N1. A second terminal (source) of the N-type transistor Tr3 is connected to a second power supply line 26b, and a control terminal (gate) of the N-type transistor Tr3 is connected to a common node N2. The first terminal (drain) of the first P-type transistor for error amplification Tr1 is used as the output terminal of the error amplifier for feedback 34 and is connected to the input terminal of the smoothing circuit 36.

The reference voltage for photodetection 20a is input into a control terminal (gate) of the second P-type transistor for error amplification Tr2. A first terminal (drain) of the second P-type transistor for error amplification Tr2 is connected to a first terminal (drain) of the N-type transistor Tr4, and a second terminal (source) of the second P-type transistor for error amplification Tr2 is connected to the common node N1. A second terminal (source) of the N-type transistor Tr4 is connected to the second power supply line 26b, and a control terminal (gate) of the N-type transistor Tr4 is connected to the common node N2. The common node N2 is connected to the first terminal (drain) of the N-type transistor Tr4.

One terminal of the current supply for error amplification Icm1 is connected to the common node N1 and another terminal of the current supply for error amplification Icm1 is connected to the first power supply line 26a. As the current supply for error amplification Icm1, for example, a current mirror circuit or resistor may be used. Although in the present embodiment, active load circuits are used as the first load for error amplification and the second load for error amplification, resistors may be used respectively instead.

Likewise, the transconductance amplifier 22 has a first P-type transistor for conversion Tr5, a second P-type transistor for conversion Tr6, an N-type transistor Tr7 (first load for conversion), an N-type transistor Tr8 (second load for conversion), and a current supply for conversion Icm2.

A control terminal (gate) of the first P-type transistor for conversion Tr5 is connected to the feedback node 28b, a first terminal (drain) of the first P-type transistor for conversion Tr5 is connected to a first terminal (drain) of the N-type transistor Tr7, and a second terminal (source) of the first P-type transistor for conversion Tr5 is connected to a common node N3. A second terminal (source) of the N-type transistor Tr7 is connected to the second power supply line 26b, and a control terminal (gate) of the N-type transistor Tr7 is connected to a common node N4. The first terminal (drain) of the first P-type transistor for conversion Tr5 is connected to the output node 28c and is connected to a selecting switch 62.

The reference voltage for conversion 20b is input into a control terminal (gate) of the second P-type transistor for conversion Tr6. A first terminal (drain) of the second P-type transistor for conversion Tr6 is connected to a first terminal (drain) of the N-type transistor Tr8, and a second terminal (source) of the second P-type transistor for conversion Tr6 is connected to the common node N3. A second terminal (source) of the N-type transistor Tr8 is connected to the second power supply line 26b, and a control terminal (gate) of the N-type transistor Tr8 is connected to the common node N4. The common node N4 is connected to the first terminal (drain) of the N-type transistor Tr8.

One terminal of the current supply for conversion Icm2 is connected to the common node N3 and another terminal of the current supply for conversion Icm2 is connected to the first power supply line 26a. As the current supply for error amplification Icm2, for example, a current mirror circuit or resistor may be used. Although in the present embodiment, active load circuits are used as the first load for conversion and the second load for conversion, other arrangements that can convert the input voltage difference between Tr5 and Tr6 to a current may be used instead.

The circuit for detecting timing of photodetection 70 has a capacitor for comparison 71, a DC voltage supply for comparison 75, a comparator 76, a circuit for controlling charge/discharge 77, and a reference voltage for comparison 78.

A first terminal of the capacitor for comparison 71 is connected to an output terminal of the adder 14, and a second terminal of the capacitor for comparison 71 is connected to a first input terminal of the comparator 76. One terminal of the DC voltage supply for comparison 75 is connected via the circuit for controlling charge/discharge 77 to the first input terminal of the comparator 76. Another terminal of the DC voltage supply for comparison 75 is connected to a third power supply line 26c, which is equipotential to the second power supply line 26b. The reference voltage for comparison 78 is input into a second input terminal of the comparator 76. The circuit for controlling charge/discharge 77 is arranged from a resistor 72 connected in parallel to a resistor 73 and a switch 74 that are connected in series.

The reference voltage for comparison 78 is a fixed voltage generated by a circuit, such as a band-gap reference circuit, that generates a fixed voltage, and may be the same as the reference voltage for photodetection 20a, the reference voltage for conversion 20b, and the reference voltage for addition 42.

An operation of the photodetecting circuit 10 according to the first embodiment of the present invention shall now be described. First, the light detected by the photodetecting circuit 10 shall be described. An unillustrated vehicle-installed radar apparatus illuminates laser light, emitted from a light emitting element, in a plurality of directions spanning at least the interior of a predetermined angular range in a vehicle width direction by means of a polygon mirror having a plurality of reflecting angles. Each laser light is reflected by a reflecting object and becomes reflected light. Also, in an outdoor environment, disturbing light, such as sunlight, is present. The reflected light and the disturbing light are included in the detected light detected by the photodetecting circuit 10.

First, a transient state shall be considered. The photodetecting element 16 detects the light and a current that is in accordance with the detected light is input into the transimpedance amplifier 18 for photodetection. The transimpedance amplifier 18 for photodetection operates to make the voltage at the input node 28a be equal to the reference voltage for photodetection 20a and makes the input current flow through the feedback resistor for photodetection 32. The voltage at the feedback node 28b is thus made lower than the reference voltage for photodetection 20a by the voltage drop at the feedback resistor for photodetection 32.

The error amplifier for feedback 34 of the feedback circuit 24 amplifies the error difference between the voltage at the feedback node 28b and the reference voltage for photodetection 20a and outputs an amplified error voltage. The amplified error voltage is smoothened by the smoothing circuit 36 and input into the control terminal (gate) of the N-type feedback transistor 38. By the voltage at the control terminal (gate), a DC current is made to flow across the first terminal (drain) and the second terminal (source) of the N-type feedback transistor 38. Thus, in a normal operating state, a DC component of the current that flows into the transimpedance amplifier for photodetection 18 is eliminated, and a DC component of the voltage at the feedback node 28b is kept fixed and equal to the reference voltage for photodetection 20a.

Actually, because a low-pass filter is constituted by the capacitor of the smoothing circuit 36 and an output impedance of the error amplifier for feedback 34, low-frequency components of the current that flows into the transimpedance amplifier for photodetection 18, that is, low frequency components of no more than a cutoff frequency of the low-pass filter are also eliminated, and with the voltage at the feedback node 28b, low-frequency components are reduced and the DC component is kept fixed and equal to the reference voltage for photodetection 20a.

Because the transconductance amplifier 22 converts the difference voltage between the voltage at the feedback node 28b and the reference voltage for conversion 20b to a current and outputs the current to the output node 28c, low frequency components of the output current are reduced and a DC component of the output current is fixed. Because the adder 14 performs addition and voltage conversion of the currents, which are from the plurality of output nodes 28c and are reduced in low frequency components and made fixed in DC component, and outputs the resulting voltage, low frequency components of the output voltage are reduced and a DC component of the output voltage is fixed in accordance with the number of circuits for photodetection 12 selected by the circuit for controlling selection 60 and the selecting switches 62.

Figure 3:
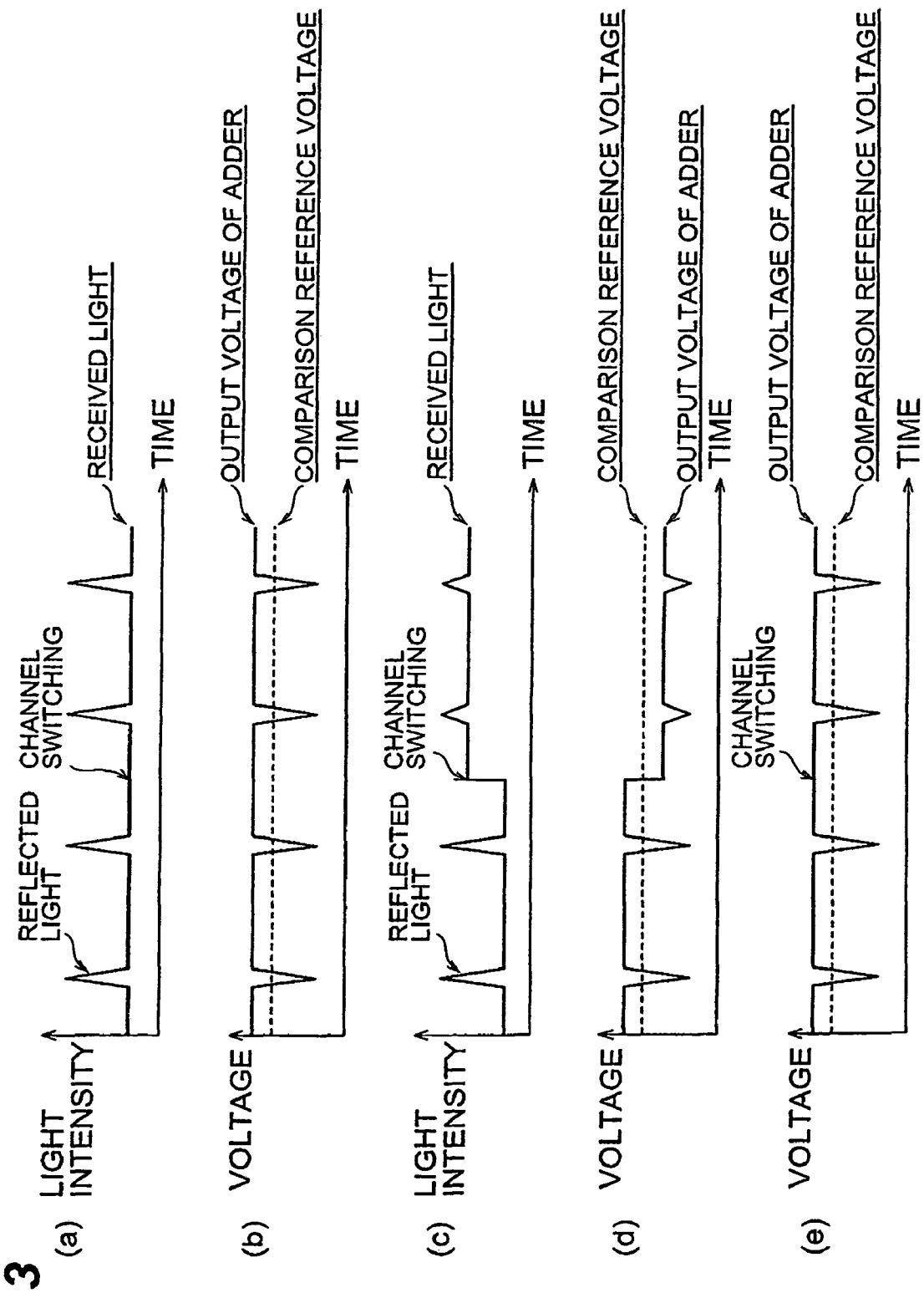
FIG. 3-($a$) is a timing chart of a light intensity, FIG. 3-($b$) is a timing chart of a voltage, FIG. 3-($c$) is a timing chart of a light intensity, FIG. 3-($d$) is a timing chart of a voltage, and FIG. 3-($e$) is a timing chart of a voltage.

FIG. 3 shows diagrams of a relationship of the detected light and the output voltage of the adder 14. That is, FIG. 3-(a) is a timing chart of a light intensity, FIG. 3-(b) is a timing chart of a voltage, FIG. 3-(c) is a timing chart of a light intensity, FIG. 3-(d) is a timing chart of a voltage, and FIG. 3-(e) is a timing chart of a voltage. As shown in FIG. 3-(a), the detected light is light with which pulse-form reflected light is superimposed on disturbing light. Upon photodetecting the detected light, the photodetecting circuit 10 according to the present embodiment outputs, from the adder 14, a voltage, such as shown in FIG. 3-(b), with which pulse voltages that are in accordance with the pulse-form reflected light are superimposed on a DC voltage that is in accordance with the disturbing light.

Via the capacitor for comparison 71, the circuit for detecting timing of photodetection 70 takes out the output from the adder 14 in a form in which the DC component is cut. Via the circuit for controlling charge/discharge 77, having the resistor 72 mounted in parallel to the circuit having the resistor 73 and the switch 74 connected in series, the DC voltage of the DC voltage supply for comparison 75 is superimposed onto the output from the adder 14, with which the DC component has been cut, and the resulting voltage is input into the first input terminal of the comparator 76. The comparator 76 detects a photodetecting timing at which the output voltage, input into the first input terminal, crosses the reference voltage for comparison 78, and detects a reflecting object based on a time between a timing of illumination of laser light and a timing of photodetecting of reflected light. To improve the detection precision of the timing of photodetection, the reference voltage is set close to the DC voltage of the output voltage.

The circuit for controlling charge/discharge 77, having the resistor 72 mounted in parallel to the circuit having the resistor 73 and the switch 74 connected in series, is a quick-charge circuit, which, when required to eliminate offset variations, turns ON the switch 74 and charges and discharges the capacitor 71 rapidly at a small time constant by using the resistor 73 that has an adequately low resistance in comparison to the resistor 72.

However, when in a case where the feedback circuit 24 of the present embodiment is not provided, a selected channel to be subject to addition is switched as shown in FIG. 3-(c), that is, a channel of low disturbing light is switched to a channel of high disturbing light, the current input into the transimpedance amplifier for photodetection 18 increases and the DC component of the voltage at the feedback node 28b drops due to a voltage drop at the feedback resistor for photodetection 32. The DC component of the output current of the transconductance amplifier 22 thus increases and the DC component of the output voltage of the adder 14 decreases.

In this case, the timings at which the output voltage of the adder 14 crosses the reference voltage for comparison 78 of the circuit for detecting timing of photodetecting 70 disappear as shown in FIG. 3-(d). Although in general, the output of the adder 14 is not processed as it is in the DC form but is subject to the cutting of the DC component by the comparison capacitor 71 and is processed upon being biased again thereafter as described above, because even if the DC component is cut, coupling by a CR high-pass filter without the switch 74 is normally performed, depending on the CR time constant, the timings at which the output voltage crosses the reference voltage for comparison 78 at the comparator 76 may disappear as shown in FIG. 3-(d) even after passage through the high-pass filter, thereby disabling the detection of the photodetecting timing of the reflected light.

Also, when the number of selected channels to be subject to addition is changed, that is for example, when the number of selected channels is increased, even if the disturbing light entering into each channel is of the same level, the DC component of the output voltage of the adder 14 decreases and the same phenomenon as that described above occurs.

With the present embodiment, the feedback circuit 24 eliminates the DC component and the low frequency components of the current input into the transimpedance amplifier for photodetection 18, reduces the low frequency components of the voltage at the feedback node 28b, and keeps the DC component of the voltage at the feedback node 28b fixed and equal to the reference voltage for photodetecting 20a. The low frequency components of the output current of the transconductance amplifier 22 are thus reduced while the DC component of the output current is fixed. The low frequency components of the output voltage of the adder 14 are thus reduced while the DC component of the output voltage is kept fixed.

As shown in FIG. 3-(e), the output voltage of the adder 14 constantly crosses the reference voltage for comparison 78 of the circuit for detecting timing of photodetection 70, thereby enabling the timing for detection of reflected light to be detected. The same holds even when channel switching is performed and when the number of selected channels to be subject to addition is changed.

Because with the embodiment according to the present invention, the feedback circuit 24 thus eliminates the disturbing light components, and reduces the low frequency components and keeps fixed the DC component of the output voltage of the photodetecting circuit 10, the output voltage of the photodetecting circuit 10 can be compared with the reference voltage that is set close to the DC component of the output voltage. Thus, by using the photodetecting circuit 10 according to the present invention, the detection precision of reflected light, reflected by a reflecting object, can be improved without being influenced by the disturbing light that is present in the outdoor environment.

Also, because the circuit for photodetection 12 is partitioned, degradation of the frequency band due to parasitic capacitance of the photodetecting element 16 is alleviated.

Also, because the amplifiers (the transimpedance amplifier for photodetection 18 and the transconductance amplifier 22) are connected according to each photodetecting element 16, even if the number of circuits for photodetection 12, that is, the number of photodetecting elements 16, which are connected to the adder 14 by the circuit for controlling selection 60 and the selecting switches 62, increases or decreases, the gain-frequency characteristics of the amplifiers do not fluctuate and the detection precision of the photodetecting circuit 10 is thus stable.

Because the adder 14 performs current addition, the gain-frequency characteristics thereof do not vary according to the number of channels as in a case where voltage addition is performed. The gain and the frequency band of the adder 14 thus do not vary. Although for time-of-flight measurement, with which a reflecting object is detected based on a time between a timing of illumination of laser light and a timing of photodetection of reflected light, the variation of the gain or the frequency band of the photodetecting circuit 10 is a cause of measurement error, this measurement error does not occur with the present invention.

The respective selecting switches 62 that are made to operate by a signal from the circuit for controlling selection 60 selectively connect the respective circuits for photodetection 12 to the adder 14. Thus, just the necessary and adequate circuits for photodetection 12, among the plurality of circuits for photodetection 12, can be connected to the adder 14 for preventing the missing of light in predicting an incident position of reflected pulse light, predicting an incident position of ghost light of reflected pulse light, and receiving reflected pulse light. That is, because the circuits for photodetection 12 without output signals can be cut off from the adder 14, the output of the photodetecting circuit 10 can be made large in S/N ratio.

Also, because the disturbing light components are eliminated according to each circuit for photodetection 12, even if the disturbing light varies according to each photodetecting element 16, a high detection precision can be maintained.

Furthermore, the photodetection precision can be improved by a simple circuit arrangement.

Figure 4:
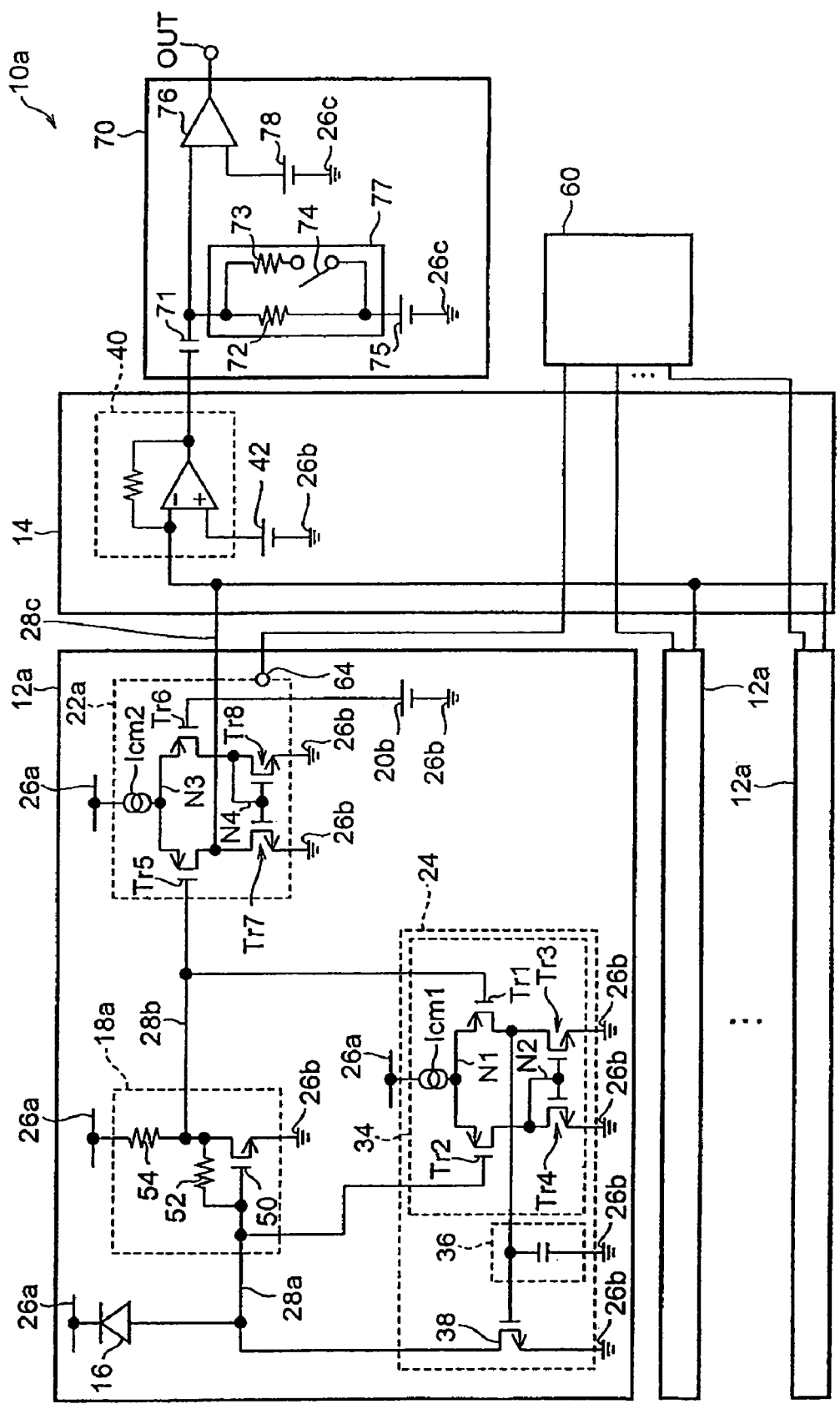
FIG. 4 is a circuit diagram of an arrangement of a photodetecting circuit according to a second embodiment of the present invention.

A photodetecting circuit according to a second embodiment of the present invention shall now be described. FIG. 4 is a circuit diagram of an arrangement of the photodetecting circuit according to the second embodiment of the present invention. The photodetecting circuit 10a, shown in FIG. 4, differs from the first embodiment in that in each of circuits for photodetection 12a, a transimpedance amplifier for photodetection 18a is used in place of the transimpedance amplifier for photodetection 18 and the reference voltage for photodetection 20a is not provided. Another difference with respect to the first embodiment is that the positive input terminal (second input terminal) of the error amplifier for feedback 34 of the feedback circuit 24 is connected to the input node 28a.

That is, the photodetecting circuit 10a differs from the first embodiment in using a gate-source voltage $V_{gs}$ of an N-type transistor for photodetection 50 in place of the reference voltage for photodetection 20a. Other points of difference with respect to the first embodiment are that the selecting switches 62 are not used, and in place of the transconductance amplifier 22, a transconductance amplifier 22a, having a transconductance amplifier operation control terminal 64 that receives the signal from the circuit for controlling selection 60, is used.

The transimpedance amplifier 18a for photodetection has the N-type transistor for photodetection 50, a second feedback resistor for photodetection 52, and a current control resistor 54. A control terminal (gate) of the N-type transistor for photodetection 50 is connected to the input node 28a. A first terminal (drain) of the N-type transistor for photodetection 50 is connected to the feedback node 28b, and the second terminal (source) of the N-type transistor for photodetection 50 is connected to the second power supply line 26b.

One end of the second feedback resistor for photodetection 52 is connected to the input node 28a and another end of the second feedback resistor for photodetection 52 is connected to the feedback node 28b. One end of the current control resistor 54 is connected to the first power supply line 26a and another end of the current control resistor 54 is connected to the feedback node 28b. The output current of the photodetecting element 16 is input into the transimpedance amplifier 18a for photodetection, which outputs a voltage that is in accordance with the output current.

The feedback circuit 24 eliminates the DC component of the current input into the transimpedance amplifier 18a for photodetection and thereby keeps the DC component of the output voltage of the transimpedance amplifier 18a for photodetection constant and equal to the DC component of the input voltage of the transimpedance amplifier 18a for photodetection.

At the terminal 64 for controlling the operation of transconductance amplifier, the transconductance amplifier 22a receives the signal from the circuit for controlling selection 60 and the transconductance amplifier 22a determines whether to operate or not operate based on this signal. For example, in accordance with the signal input into the terminal 64 for controlling the operation of transconductance amplifier, the current supply Icm2 is controlled to be ON or OFF.

An operation of the photodetecting circuit 10a according to the second embodiment of the present invention shall now be described.

First, a transient state shall be considered. The photodetecting element 16 detects light, and then a current that is in accordance with the detected light is input into the transimpedance amplifier 18a for photodetection. The transimpedance amplifier 18a for photodetection makes the input current flow across the first terminal (drain) and the second terminal (source) of the N-type transistor for photodetection 50 via the second feedback resistor for photodetection 52. The voltage at the feedback node 28b is thus made lower than the voltage at the input node 28a by the voltage drop at the second feedback resistor for photodetection 52.

The error amplifier for feedback 34 of the feedback circuit 24 amplifies the error difference between the voltage at the feedback node 28b and the voltage at the input node 28a and outputs an amplified error voltage. The amplified error voltage is smoothened by the smoothing circuit 36 and input into the control terminal (gate) of the N-type feedback transistor 38. By the voltage at the control terminal (gate), a DC current is made to flow across the first terminal (drain) and the second terminal (source) of the N-type feedback transistor 38.

Here the voltage at the input node 28a is determined by the drain current of the N-type transistor for photodetection 50 and is substantially fixed. Thus, in a normal operating state, a DC component of the current that flows into the transimpedance amplifier 18a for photodetection is eliminated, and a DC component of the voltage at the feedback node 28b is kept fixed and equal to the voltage at the input node 28a.

Actually, because a low-pass filter is constituted by the capacitor of the smoothing circuit 36 and an output impedance of the error amplifier for feedback 34, low-frequency components of the current that flows into the transimpedance amplifier 18 for photodetection, that is, low frequency components of no more than a cutoff frequency of the low-pass filter are also eliminated, and the DC component of the voltage at the feedback node 28b is kept fixed and equal to the reference voltage for photodetection 20a.

Because with the embodiment according to the present invention, the feedback circuit 24 thus eliminates the disturbing light components and keeps fixed the DC component of the output voltage of the photodetecting circuit 10a, the output voltage of the photodetecting circuit 10a can be compared with the reference voltage that is set close to the DC component of the output voltage. Thus, by using the photodetecting circuit 10a according to the present invention, the detection precision of reflected light, reflected by a reflecting object, can be improved without being influenced by the disturbing light that is present in the outdoor environment.

Also, because the circuit for photodetection 12a is partitioned, degradation of the frequency band due to parasitic capacitance of the photodetecting element 16 is alleviated.

Also, because the amplifiers (the transimpedance amplifier 18a for photodetection and the transconductance amplifier 22a) are connected according to each photodetecting element 16 and the current supply Icm2 is controlled to be ON or OFF by the circuit for controlling selection 60 and the signal input into the terminal 64 for controlling operation of transconductance amplifier to selectively connect the circuits for photodetecting 12 to be connected to the adder 14, even if the number of circuits for photodetection 12, that is, the number of photodetecting elements 16 connected to the adder 14 increases or decreases, the gain-frequency characteristics of the amplifiers do not fluctuate and the detection precision of the photodetecting circuit 10a is stable.

Because the adder 14 performs current addition, the gain-frequency characteristics of the adder 14 do not vary according to the number of channels as in a case where voltage addition is performed. The gain and the frequency band of the adder 14 thus do not vary. Although for time-of-flight measurement, with which a reflecting object is detected based on a time between a timing of illumination of laser light and a timing of photodetecting of reflected light the variation of the gain or the frequency band of the photodetecting circuit 10 is a cause of measurement error, this measurement error does not occur with the present invention.

Also, because the current supply Icm2 is controlled to be ON or OFF by the signal input into the terminal 64 of controlling the operation of transconductance amplifier from the selection control circuit 60, the respective circuits for photodetection 12 can be connected selectively to the adder 14. Thus, just the necessary and adequate circuits for photodetection 12, among the plurality of circuits for photodetection 12, can be connected to the adder 14 for preventing the missing of light in predicting an incident position of reflected pulse light, predicting an incident position of ghost light of reflected pulse light, and receiving reflected pulse light. That is, because circuits for photodetection 12 without output signals can be cut off from the adder 14, the output of the photodetecting circuit 10 can be made large in S/N ratio.

Also, because the disturbing light components are eliminated according to each circuit for photodetection 12a, even if the disturbing light varies according to each photodetecting element 16, a high detection precision can be maintained.

Furthermore, the light detection precision can be improved by a simple circuit arrangement.

Figure 5:
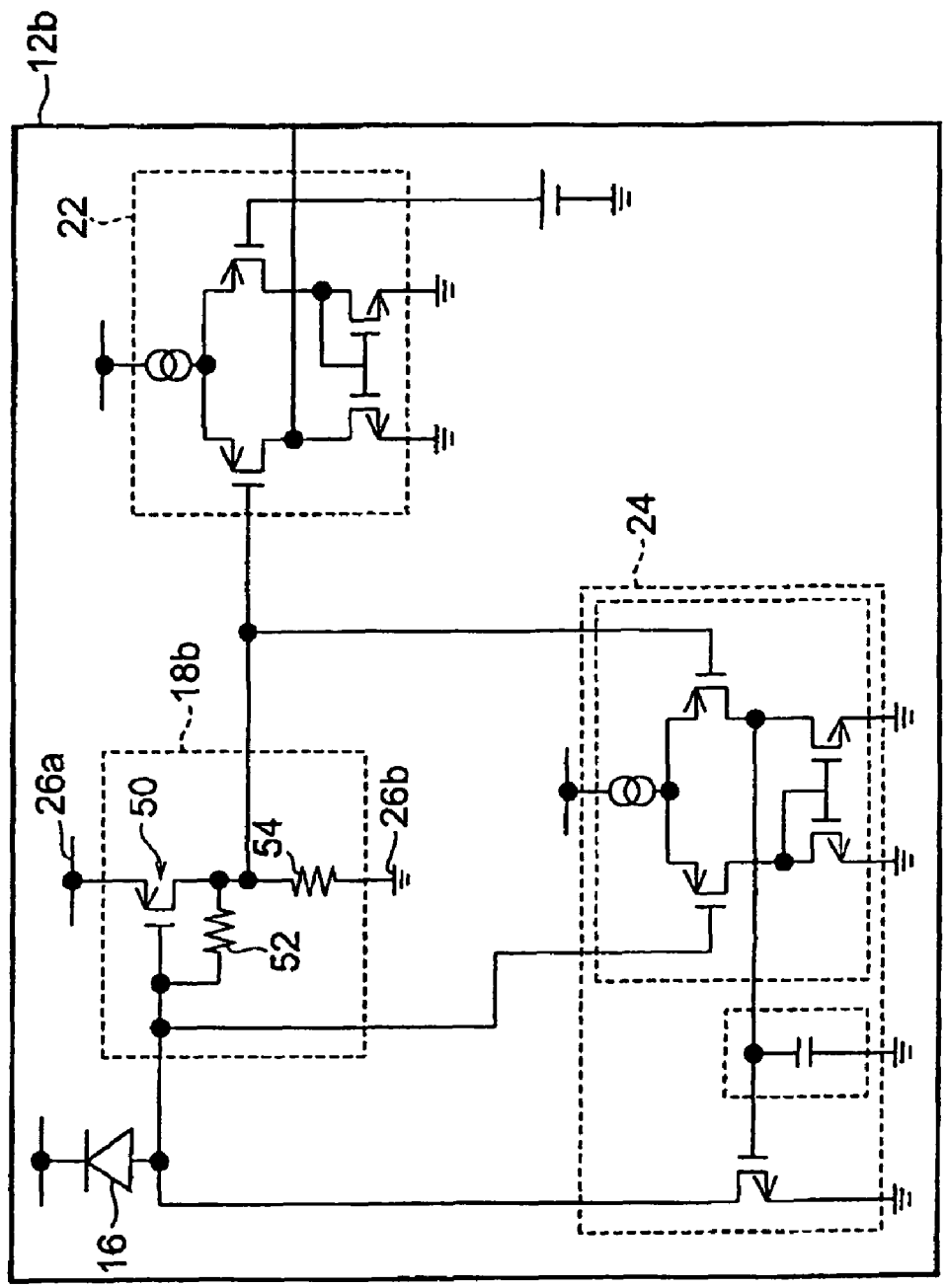
FIG. 5 is a circuit diagram of a modification example of the arrangement of the circuit for photodetection according to the second embodiment of the present invention.

The present invention is not restricted to the embodiments described above and various modifications are possible. As shown in FIG. 5, the circuit for photodetection 12a may have the arrangement of the circuit for photodetection 12b. The circuit for photodetection 12b differs from the circuit for photodetection 12a in that the transimpedance amplifier 18a for photodetection is replaced by a transimpedance amplifier 18b for photodetection. The transimpedance amplifier 18b for photodetection differs from the transimpedance amplifier 18a for photodetection in that transistor for photodetection 50 is changed from an N-type transistor to a P-type transistor. The second terminal (source) of the transistor for photodetection 50 is thus connected to the first power supply line 26a, and the current control resistor 54 is connected to the second power supply line 26b.

Figure 6:
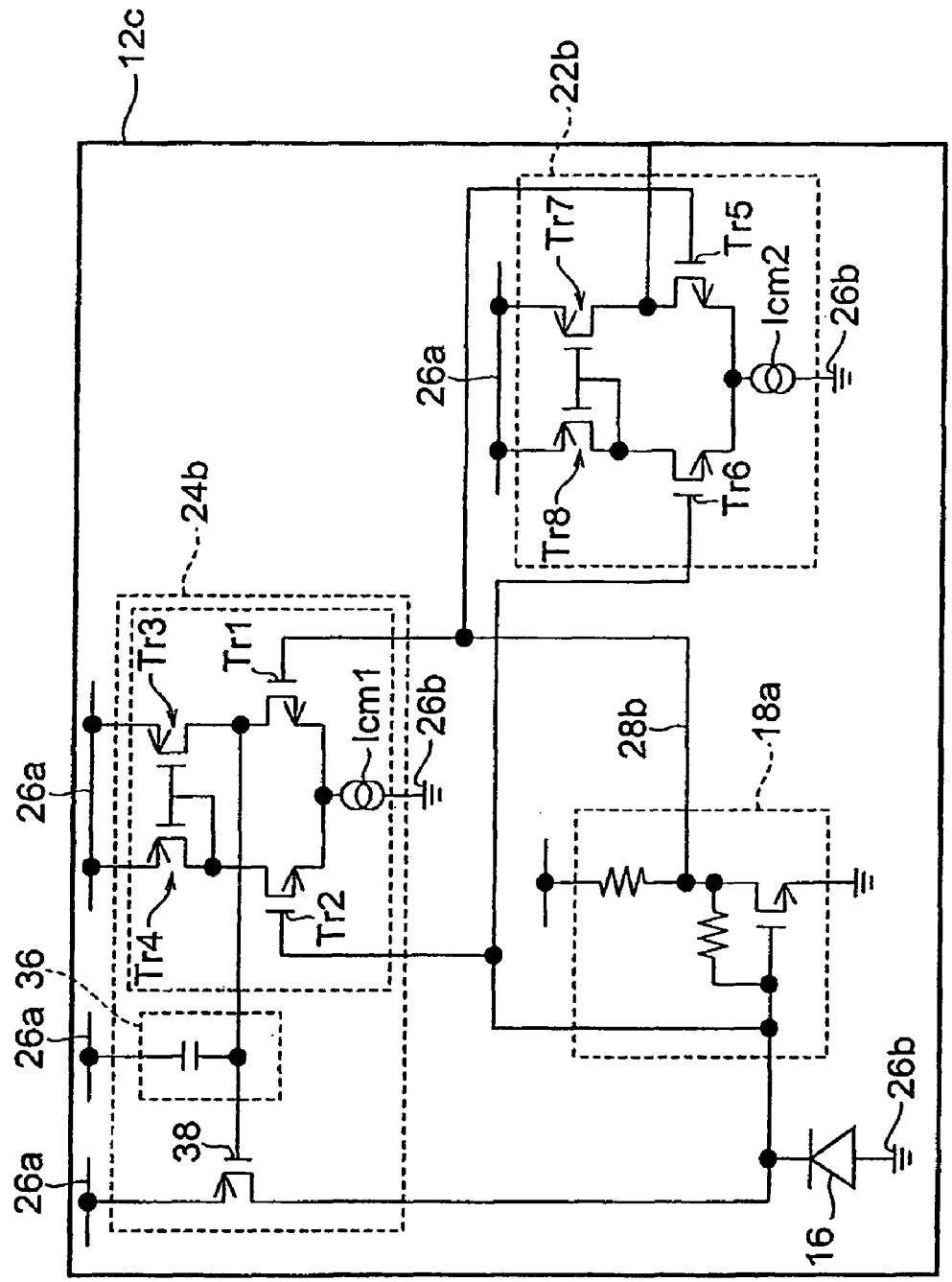
FIG. 6 is a circuit diagram of a modification example of the arrangement of the circuit for photodetection according to the second embodiment of the present invention.

Also, as shown in FIG. 6, the circuit for photodetection 12a may have the arrangement of the circuit for photodetection 12c. The circuit for photodetection 12c differs from the circuit for photodetection 12a in that an arrangement, in which the voltage drop of the photodetecting element, which is a substantially fixed voltage, is determined from the first power supply line 26a, is changed to an arrangement, in which the voltage drop is determined from the second power supply line 26b. In this case, because the voltage variation at the feedback node 28b is reverse in direction that in the case of the circuit for photodetection 12a, the circuit for photodetection 12c differs from the circuit for photodetection 12a in that the feedback circuit 24 is replaced by a feedback circuit 24b and the transconductance amplifier 22a is replaced by a transconductance amplifier 22b.

The feedback circuit 24b differs from the feedback circuit 24 in that the first transistor for error amplification Tr1 and the second transistor for error amplification Tr2 are changed from P-type transistors to N-type transistors, the transistor Tr3 and the transistor Tr4 are changed from N-type transistors to P-type transistors, and the feedback transistor 38 is changed from an N-type transistor to a P-type transistor.

The second terminals (sources) of the transistor Tr3 and the transistor Tr4 are thus connected to the first power supply line 26a, and the current supply for error amplification Icm1 is connected to the second power supply line 26b. The capacitor of the smoothing circuit 36 and the second terminal (source) of the feedback transistor 38 are connected to the first power supply line 26a.

The transconductance amplifier 22b differs from the transconductance amplifier 22 in that the first transistor for conversion Tr5 and the second transistor for conversion Tr6 are changed from P-type transistors to N-type transistors and the transistor Tr7 and the transistor Tr8 are changed from N-type transistors to P-type transistors. The second terminals (sources) of the transistor Tr7 and the transistor Tr8 are thus connected to the first power supply line 26a, and the current supply for error amplification Icm2 is connected to the second power supply line 26b.

Figure 7:
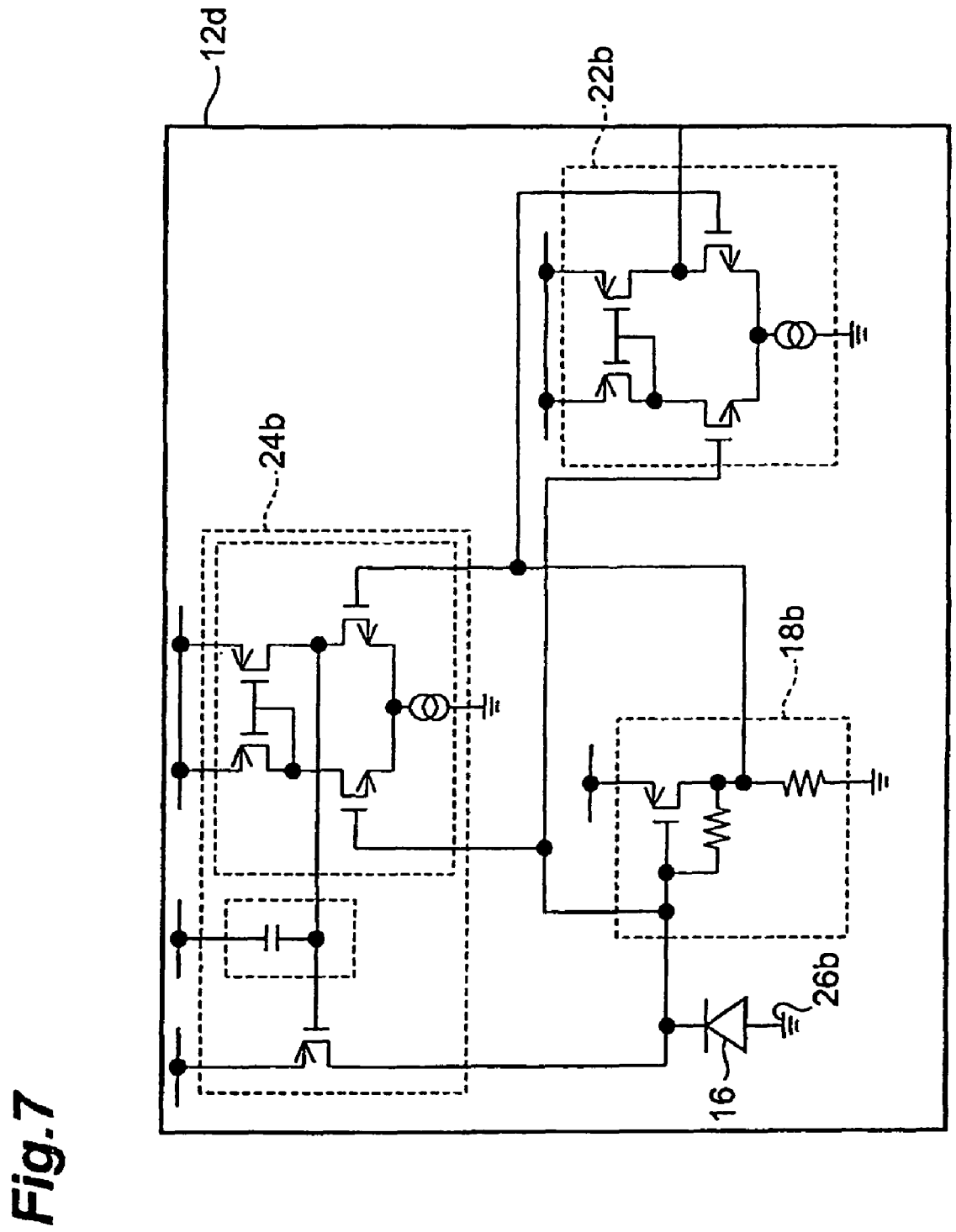
FIG. 7 is a circuit diagram of a modification example of the arrangement of the circuit for photodetection according to the second embodiment of the present invention.

Also, as shown in FIG. 7, the circuit for photodetection 12c may have the arrangement of a circuit for photodetection 12d. The circuit for photodetection 12d differs from the circuit for photodetection 12c in that the transimpedance amplifier 18a for photodetection is replaced by the transimpedance amplifier 18b for photodetection.

Figure 8:
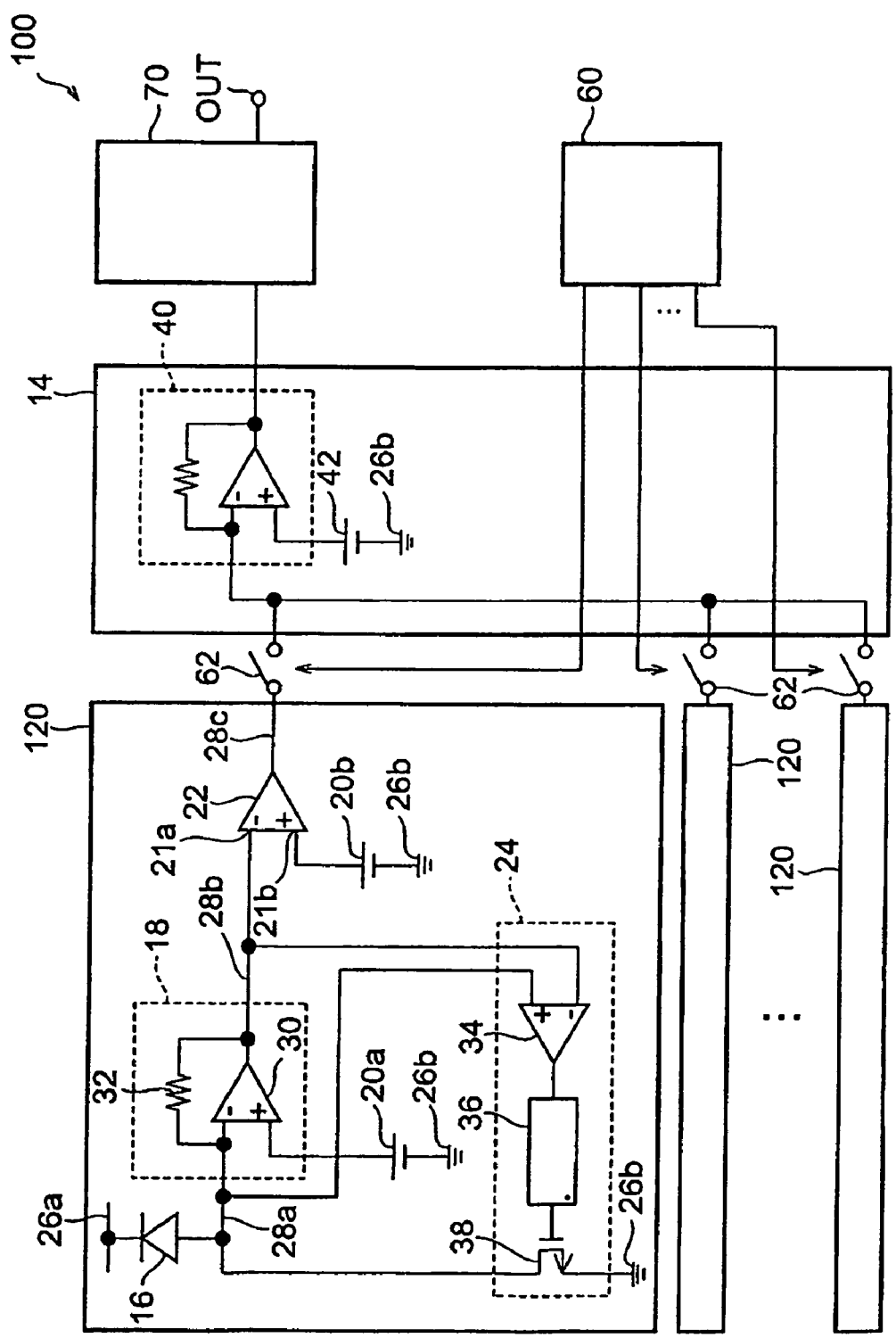
FIG. 8 is a circuit diagram of a modification example of the arrangement of the circuit for photodetection according to the first embodiment of the present invention.

Also, as shown in FIG. 8, the photodetecting circuit 10 may have the arrangement of a photodetecting circuit 100. The photodetecting circuit 100 differs from the photodetecting circuit 10 in using a circuit for photodetection 120 in place of the circuit for photodetection 12. The circuit for photodetection 120 differs from the circuit for photodetection 12 in that the second input terminal of the error amplifier for feedback 34 is connected not to the reference voltage for photodetection 20a but to the first input terminal of the transimpedance amplifier 18 for photodetection. Because the voltage at the first input terminal of the transimpedance amplifier 18 for photodetection is substantially the same as the voltage at the second input terminal, the circuit for photodetection 120 performs the same operation as the circuit for photodetection 12.

The photodetecting circuit 100 thus performs the same operation as the photodetecting circuit 10.

Figure 9:
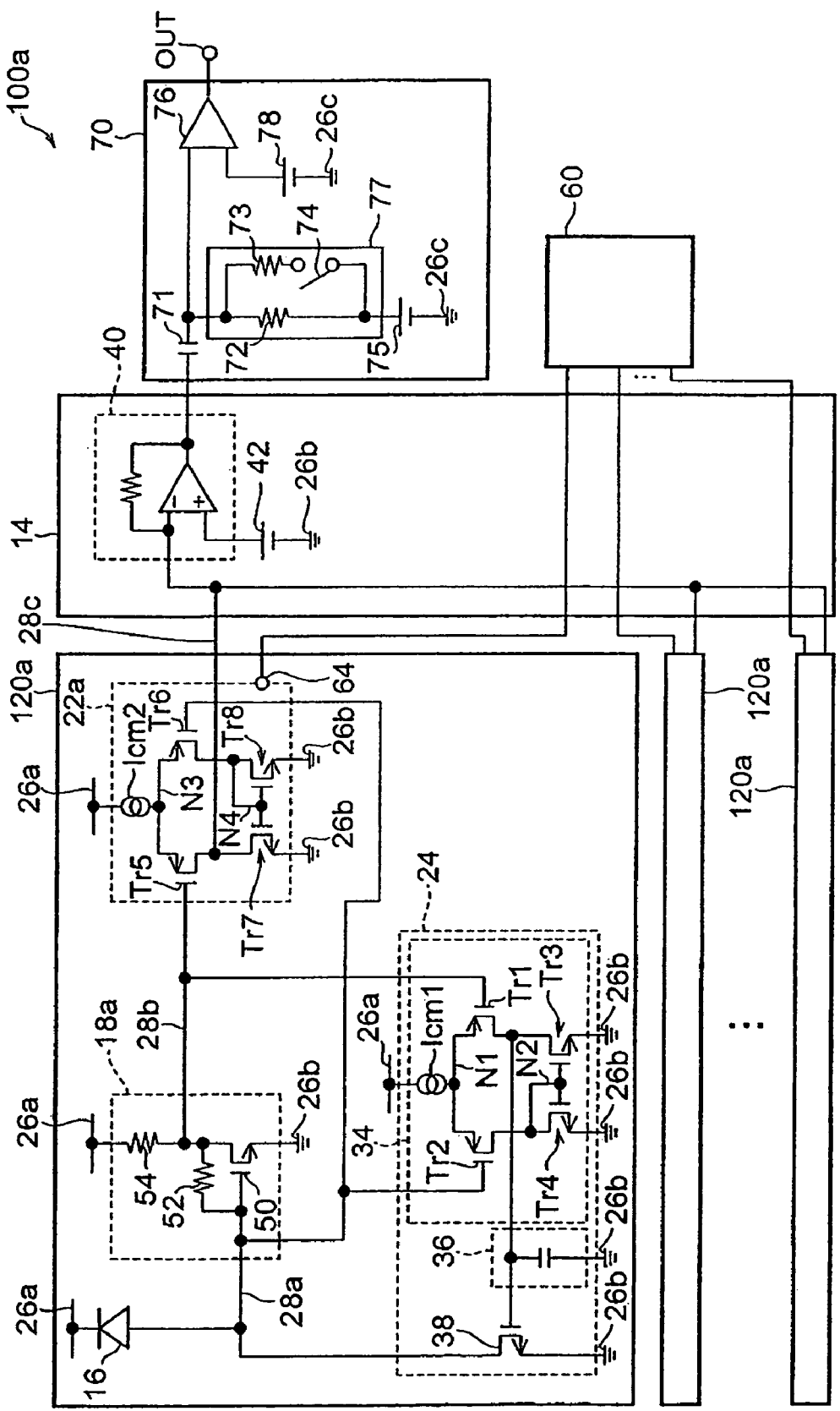
FIG. 9 is a circuit diagram of a modification example of the arrangement of the circuit for photodetection according to the second embodiment of the present invention.

Also, as shown in FIG. 9, the photodetecting circuit 10a may have the arrangement of a photodetecting circuit 100a. The photodetecting circuit 100a differs from the photodetecting circuit 10a in using a circuit for photodetection 120a in place of the circuit for photodetection 12a. The circuit for photodetection 120a differs from the circuit for photodetection 12a in not having the reference voltage for conversion 20b. The circuit for photodetection 120a also differs from the circuit for photodetection 12a in that the control terminal of the second P-type transistor for conversion Tr6 of the transconductance amplifier 22a is connected to the input node 28a. That is, the circuit for photodetection 120a differs from the circuit for photodetection 12a in using the gate-source voltage $V_{gs}$ of the N-type transistor for photodetection 50 in place of the reference voltage for conversion 20b. Because as mentioned above, the voltage $V_{gs}$ of the N-type transistor for photodetection 50 is substantially fixed, the circuit for photodetection 120a performs the same operation as the circuit for photodetection 12a. The photodetecting circuit 100a thus performs the same operation as the photodetecting circuit 10a.

Although field effect transistors are used as the transistors in the embodiments, bipolar transistors may be used instead.

Also, as a method for realizing the terminal for controlling the operation of the transconductance amplifier, switching elements may be provided in the current supply Icm1 and the current supply Icm2. Specifically, a switching element that short-circuits the control terminal (gate) of a transistor of a current mirror circuit to the first or the second power supply line is provided. By this arrangement, a circuit for photodetection that is not used can be stopped and the consumption power can be lowered. Degradation of frequency characteristics due to circuits for photodetection that are not used can also be alleviated.

Control terminals that are the same as the terminal for controlling the operation of transconductance amplifier may be provided in the transimpedance amplifier, the circuit for error amplification, etc. In such a case, although the power supply of the circuit for photodetection must be turned ON at a fixed time before making the circuit for photodetection operate, further lowering of consumption power is possible and degradation of frequency characteristics can be alleviated further.

The invention claimed is:

1. A photodetecting circuit comprising: an adder, selectively adding outputs of a plurality of circuits for photodetection;
   each of the circuits for photodetection in turn comprising:
   a photodetecting element;
   a transimpedance amplifier for photodetection, with a first input terminal connected to the photodetecting element;
   a transconductance amplifier, with a first input terminal connected to an output terminal of the transimpedance amplifier for photodetection; and
   a feedback circuit, connected between the output terminal of the transimpedance amplifier for photodetection and the first input terminal of the transimpedance amplifier for photodetection and applying feedback to keep fixed an output voltage of the transimpedance amplifier for photodetection, wherein the feedback circuit comprises:
   a error amplifier for feedback, with a first input terminal connected to the output terminal of the transimpedance amplifier for photodetection and a second input terminal connected to the first input terminal of the transimpedance amplifier for photodetection;
   a smoothing circuit, with an input terminal connected to an output terminal of the error amplifier for feedback; and
   a feedback transistor, with a control terminal connected to an output terminal of the smoothing circuit and a terminal, connected to the photodetecting element, being connected to the first input terminal of the transimpedance amplifier for photodetection.

2. The photodetecting circuit according to claim 1, wherein the transimpedance amplifier for photodetection comprises:
   a transistor for photodetection, with a control terminal, which is the first input terminal of the transimpedance amplifier for photodetection, connected to the photodetecting element;
   a current control resistor, connected between an output terminal of the transistor for photodetection, which is the output terminal of the transimpedance amplifier for photodetection, and a fixed potential; and
   a second feedback resistor for photodetection, connected between the output terminal of the transistor for photodetection and the control terminal of the transistor for photodetection.

3. The photodetecting circuit according to claim 2, wherein the second input terminal of the error amplifier for feedback of the photodetecting circuit is connected to the control terminal of the transistor for photodetection.

4. A photodetecting circuit comprising: an adder, selectively adding outputs of a plurality of circuits for photodetection;
   each of the circuits for photodetection in turn comprising:
   a photodetecting element;
   a transimpedance amplifier for photodetection, with a first input terminal connected to the photodetecting element;
   a transconductance amplifier, with a first input terminal connected to an output terminal of the transimpedance amplifier for photodetection; and
   a feedback circuit, connected between the output terminal of the transimpedance amplifier for photodetection and the first input terminal of the transimpedance amplifier for photodetection and applying feedback to keep fixed an output voltage of the transimpedance amplifier for photodetection, further comprising:
   a circuit for controlling selection, selecting outputs of the plurality of circuits for photodetection by controlling operation or non-operation of the transconductance amplifiers; and
   wherein the adder in turn comprises: a transimpedance amplifier for addition, with an input terminal connected to the plurality of circuits for photodetection; and
   the transimpedance amplifier for addition in turn comprises: a operational amplifier for addition, with a first input terminal connected to the output terminals of the plurality of circuits for photodetection and a second input terminal connected to a reference voltage for addition; and
   a feedback resistor for addition, connected between an output terminal of the operational amplifier for addition and the first input terminal of the operational amplifier for addition.

5. A circuit for generating reference voltage comprising:

an element for photodetecting;

a transistor for photodetection, with a control terminal connected to the photodetecting element;

a current control resistor, connected between an output terminal of the transistor for photodetection and a fixed potential;

a feedback resistor for photodetection, connected between the output terminal of the transistor for photodetection and the control terminal of the transistor for photodetection;

a error amplifier for feedback, with a first input terminal connected to the output terminal of the transistor for photodetection and a second input terminal connected to the control terminal of the transistor for photodetection;

a smoothing circuit, with an input terminal connected to an output terminal of the error amplifier for feedback; and a feedback transistor, with a control terminal connected to an output terminal of the smoothing circuit and a terminal, connected to the element for photodetecting, being connected to the control terminal of the transistor for photodetection.

* * * * *